United States Patent
Cho et al.

(10) Patent No.: US 11,271,710 B1
(45) Date of Patent: Mar. 8, 2022

(54) WIDEBAND QUADRATURE PHASE GENERATION USING TUNABLE POLYPHASE FILTER

(71) Applicant: Renesas Electronics America Inc., Milpitas, CA (US)

(72) Inventors: Ilhyun Cho, Seoul (KR); Kwang-Seok Han, Seoul (KR); Soonseob Lee, Seoul (KR); Heewon Suh, Seoul (KR); Gilpyo Lee, Seoul (KR)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/106,483

(22) Filed: Nov. 30, 2020

(51) Int. Cl.
*H04L 7/00* (2006.01)
*H03K 3/012* (2006.01)
*H03B 27/00* (2006.01)
*H03H 7/21* (2006.01)

(52) U.S. Cl.
CPC .......... *H04L 7/0016* (2013.01); *H03B 27/00* (2013.01); *H03H 7/21* (2013.01); *H03K 3/012* (2013.01)

(58) Field of Classification Search
CPC ........ H04L 7/0016; H03B 27/00; H03H 7/18; H03H 7/21; H03K 3/012; H03D 13/00; H03L 7/085
See application file for complete search history.

(56) References Cited

U.S. PATENT DOCUMENTS

| | | | | |
|---|---|---|---|---|
| 4,908,532 A | * | 3/1990 | Chadwick | H03B 27/00 327/236 |
| 6,768,364 B2 | * | 7/2004 | Wang | H03B 27/00 327/238 |
| 8,554,267 B2 | * | 10/2013 | Salvi | H03H 11/16 455/550.1 |
| 10,425,062 B2 | * | 9/2019 | Kato | H03H 7/21 |
| 2020/0067497 A1 | * | 2/2020 | Frounchi | H03B 27/00 |

* cited by examiner

*Primary Examiner* — Betsy Deppe
(74) *Attorney, Agent, or Firm* — McDermott Will & Emery LLP

(57) ABSTRACT

A quadrature phase clock generator includes a tunable polyphase filter and a phase detector. The tunable polyphase filter is configured to receive an input clock signal and generate four quadrature phase clock signals. The phase detector is coupled to receive at least two of the four quadrature phase clock signals and generate a control signal adapted to tune the polyphase filter based on the received quadrature phase clock signals. Further, the phase detector is configured to provide the control signal to the polyphase filter in a feedback loop. Based on the control signal from the phase detector, the tunable polyphase filter generates four tuned quadrature phase clock signals as output phase clock signals.

18 Claims, 7 Drawing Sheets

WIDEBAND QUADRATURE PHASE
GENERATION USING TUNABLE
POLYPHASE FILTER

TECHNICAL FIELD

The present disclosure relates to quadrature phase clock signals, and more particularly to generating quadrature phase clock signals for multiple frequencies using a polyphase filter.

BACKGROUND

Modern communication and network devices are generally equipped with a clock and data recovery system (CDR). In the CDR, the internal clock is locked to input data phase and frequency. Generally, a high-speed CDR has multiple clock phases to overcome a limitation of frequency and the multiple phase internal clock that are recovered represents a mid-point and an end-point of input data.

Conventional structures for generating quadrature phase clock signals include a polyphase filter (PPF), a frequency divider (FD), and a quadrature voltage controlled oscillator (QVCO). However, each of these structures suffer from drawbacks. For example, the PPF requires a smaller area than the FD or QVCO, but has the worst frequency characteristics because it can generate quadrature phase only at a single frequency. On the other hand, the FD has the best frequency characteristics among the three structures, but is limited in applications using high speed application. The QVCO uses two VCOs and is the worst in terms of layout area and power consumption among them.

SUMMARY

The present disclosure relates to a quadrature phase clock generator that can generate accurate quadrature phase clock signals for multiple input frequencies, thereby overcoming the drawback of the conventional polyphase filter.

According to an aspect of the present disclosure, a quadrature phase clock generator that can generate quadrature phase clock signals for multiple characteristic frequencies is disclosed. The quadrature phase clock generator includes a tunable polyphase filter configured to receive an input clock and generate four quadrature phase clock signals, and a phase detector coupled to receive at least two of the four quadrature phase clock signals and generate a control signal adapted to tune the polyphase filter based on the received quadrature phase clock signals. The phase detector is configured to provide the control signal to the polyphase filter in a feedback loop, wherein the tunable polyphase filter generates four tuned quadrature phase clock signals as output phase clock signals based on the control signal from the phase detector.

According to another aspect of the present disclosure, a clock and data recovery (CDR) system is disclosed. The CDR system includes one or more quadrature phase clock generators. Each quadrature phase clock generator includes: a tunable polyphase filter configured to receive an input clock and generate four quadrature phase clock signals; and a phase detector coupled to receive at least two of the four quadrature phase clock signals and generate a feedback control signal adapted to tune the polyphase filter based on the received quadrature phase clock signals. The phase detector is configured to provide the feedback control signal to the polyphase filter, wherein the tunable polyphase filter generates four tuned quadrature phase clock signals as output phase clock signals based on the feedback control signal from the phase detector.

According to yet another aspect of the present disclosure, a method for generating quadrature phase clock signals is disclosed. The method includes receiving, by a tunable polyphase filter, an input clock signal; generating, by the tunable polyphase filter, four quadrature phase clock signals based on the input clock signal; detecting, by a phase detector, a phase difference in at least two of the four quadrature phase clock signals; generating, by the phase detector, a control signal adapted to tune the polyphase filter based on the detected phase difference in the at least two of the four quadrature phase clock signals; and providing, by the phase detector, the control signal to the tunable polyphase filter, wherein the tunable polyphase filter generates four tuned quadrature phase clock signals as output phase clock signals based on the control signal from the phase detector.

In one embodiment, the tunable polyphase filter includes one or more resistance elements and one or more capacitance elements, wherein at least one of the one or more resistance elements and the one or more capacitance elements is variable elements. In one embodiment, the tunable polyphase filter is a two-stage polyphase filter including a first polyphase filter and a second polyphase filter.

BRIEF DESCRIPTION OF THE DRAWINGS

Embodiments of the inventive aspects of this disclosure will be understood with reference to the following detailed description, when read in conjunction with the accompanying drawings.

DETAILED DESCRIPTION

Figure 1:
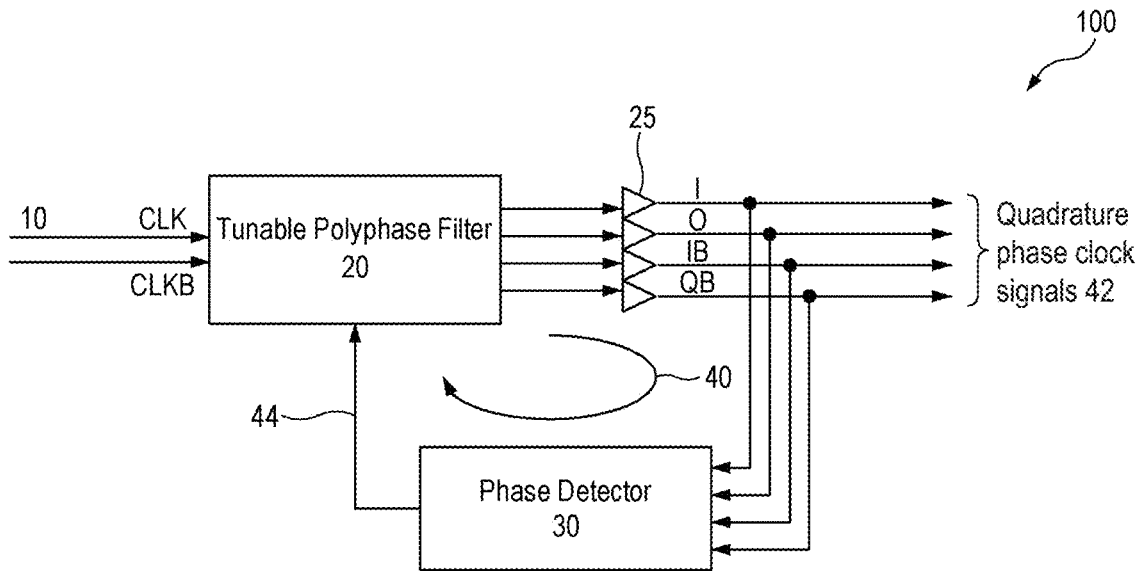
FIG. 1 illustrates a block diagram of a quadrature phase clock generator according to one embodiment of the present disclosure.

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspects of this disclosure may be practiced without these specific details. In other instances, well-known methods, procedures, systems, and components have not been described in detail so as not to unnecessarily obscure aspects of the various embodiments.

In the present disclosure, terms including technical or scientific terms, may have meanings that are generally understood by those ordinarily skilled in the art to which this disclosure belongs, unless otherwise defined.

In the present disclosure, the expressions "A include B," "A may include B," "A is provided with B," "A may be provided with B," "A have B," "A may have B," and the like, mean that corresponding features (e.g., functions, operations, or components, etc.) are present, but do not exclude the presence of other additional features. That is, such expressions should be understood as open-ended terms that include the possibility of including other embodiments.

In the present disclosure, the singular of an expression may include the meaning of the plural of the expression unless otherwise indicated in the context clearly dictates otherwise, and the same applies to singular forms of expressions as set forth in the claims.

In the present disclosure, the expressions "1st," "2nd," "first," "second," and the like are used to distinguish one object from another in referring to plural same objects unless otherwise indicated in the context, and do not limit the order or importance of the objects.

In the present disclosure, the expressions "A, B and C," "A, B or C," "A, B and/or C," "at least one of A, B, and C," "at least one of A, B, or C," "at least one of A, B, and/or C," and so on may be used to refer to each listed item or any possible combination of the listed items may be provided. For example, the expression "at least one of A and B" may be used to refer to all of (1) A, (2) B, and (3) A and B.

In the present disclosure, the expression "based on . . . " is used to describe one or more factors that affect the action or operation of a decision or determination, described in a phrase or sentence in which the expression is contained, and does not exclude additional factors that influence the action or operation of the corresponding decisions or determination.

In the present disclosure, the expression that a component (e.g., a first component) is "connected" or "coupled" to another component (e.g., a second component) may mean that the first component is connected or coupled to the second component not only directly, but also via another new component (e.g., a third component).

In the present disclosure, the expression "configured to . . . " is intended to encompass, depending on the context, the meanings of "set to . . . ," "having performance of . . . ," "altered to . . . ," "made to . . . ," and "enabled to . . . ," and the like. The corresponding expression is not limited to the meaning "specifically designed in hardware." For example, a processor configured to perform a specific operation may mean a generic-purpose processor that can perform the specific operation by executing software.

Various embodiments of the present disclosure will now be described with reference to the accompanying drawings. In the accompanying drawings and the descriptions of the drawings, substantially equivalent elements may be given the same reference numerals. In the following description of the various embodiments, a description of the same or corresponding components may be omitted. However, this does not mean that the components are not included in the embodiment.

FIG. 1 illustrates a block diagram of a quadrature phase clock generator 100 according to one embodiment of the present disclosure. The quadrature phase clock generator 100 includes a tunable polyphase filter 20 and a phase detector 30 coupled to the tunable polyphase filter 20. The polyphase filter 20 is configured to receive an input clock signal 10 and generate a plurality of quadrature phase clock signals 42 (e.g., four quadrature phase clock signals 42).

In one embodiment, the input clock signal 10 may include differential input clock signals CLK and CLKB, one of which has an inverse phase of 180° of the other input signal. The polyphase filter 20 may receive the input clock signal 10 and generates four quadrature phase clock signals 42 (i.e., I, Q, IB, and QB) with a phase difference of 90 degree between each pair of the quadrature phase clock signals 42.

The quadrature phase clock generator 100 may also include a plurality of amplifiers 25 between the tunable polyphase filter 20 and the phase detector 30. In one embodiment, four amplifiers 25 receive and amplify the four quadrature phase clock signals 42, which may be provided to the phase detector 30. Upon receiving the amplified quadrature phase clock signals 42, the phase detector 30 generates a control signal 44, which is adapted to tune the polyphase filter 20, based on the quadrature phase clock signals 42. In this configuration, the tunable polyphase filter 20 and the phase detector 30 form a phase calibration loop 40 for tuning the quadrature phase clock signals 42 for output.

Figure 2:
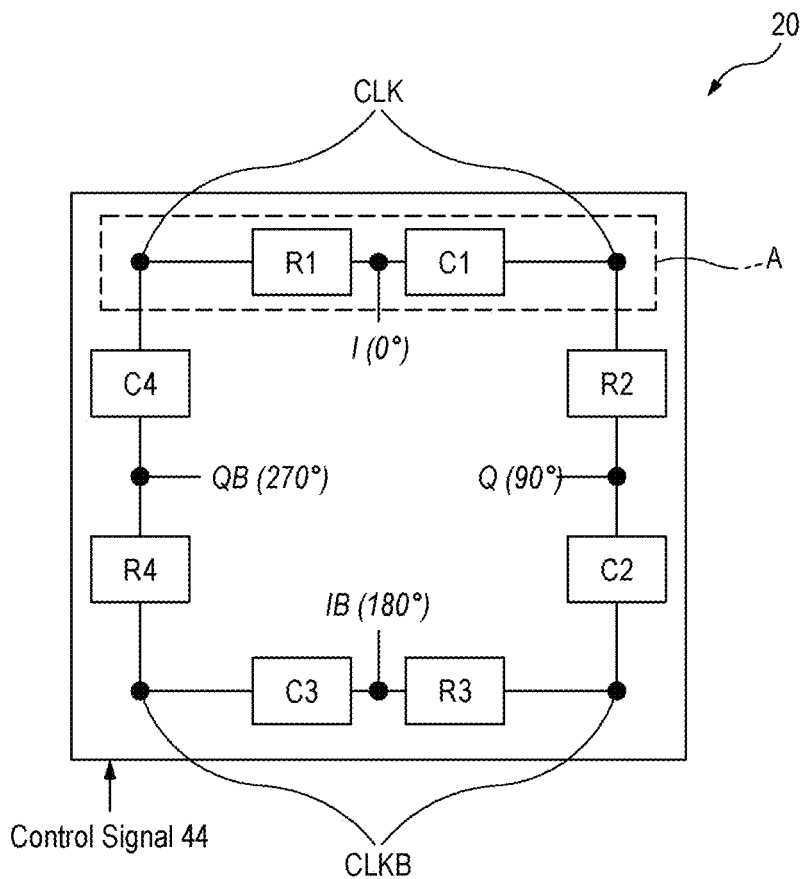
FIG. 2 illustrates a tunable polyphase filter according to one embodiment of the present disclosure.

FIG. 2 illustrates a diagram of the tunable polyphase filter 20 according to one embodiment of the present disclosure. The tunable polyphase filter 20 includes four sets of resistance and capacitance elements R1 and C1, R2 and C2, R3 and C3, and R4 and C4. The resistance and capacitance elements in each of the four sets are coupled to each other and the four sets of resistance and capacitance elements may be coupled in series in a loop and For example, the resistance elements R1, R2, R3, and R4 and four capacitance elements C1, C2, C3, and C4 are alternately connected in series. In one embodiment, the capacitance values of the four capacitance elements may be the same and the resistance values of the four resistance elements be the same. Further, the four sets of resistance and capacitance elements may be the same in structure and/or function.

In the embodiment shown in FIG. 2, the input signal CLK is provided to a node between the resistance element R1 and the capacitance element C4 and a node between the resistance element R2 and the capacitance element C1. On the other hand, the inverted input signal CLKB is provided to a node between the resistance element R3 and the capacitance element C2 and a node between the resistance element R4 and the capacitance element C3. In response, the output signal I of 0 degree phase is generated between the resistance element R1 and the capacitance element C1, the output signal Q of 90 degree phase is generated between the resistance element R2 and the capacitance element C2, the output signal IB of 180 degree phase is generated between the resistance element R3 and the capacitance element C3, and the output signal QB of 270 degree phase is generated between the resistance element R4 and the capacitance element C4. The output signals IB and QB correspond to the inverted phase signals of the output signals I and Q, respectively. Although the tunable polyphase filter 20 is illustrated with the resistance elements R1 to R4 and the capacitance elements C1 to C4, the filter 20 may include other configurations of resistance elements and capacitance elements for generating the four quadrature phase clock signals.

A polyphase filter typically generates quadrature phase clock signals with a phase difference of 90 degrees for an input clock signal having a predetermined frequency, i.e., a characteristic frequency. For example, the characteristic frequency fc of a polyphase filter is determined by the following equation:

$$fc = \frac{1}{2\pi RC}$$

where R and C are the resistance of the resistors and the capacitance of the capacitors included in the polyphase filter.

Given the above equation for the characteristic frequency, if the frequency of the input clock signal is different from the characteristic frequency of the polyphase filter, the phase difference in the output phase clock signals of the polyphase filter will not be exactly 90 degrees. That is, if the input clock signal does not have the characteristic frequency of the polyphase filter, there will be a phase mismatch in the quadrature phase clock signals outputted from the polyphase filter.

For example, as shown in Table 1 below, assuming a typical polyphase filter configured with resistors of 1,200Ω and capacitors of 10 fF, the characteristic frequency fc of the polyphase filter will be about 13.84 GHz according to the equation above. If the input clock signal has a frequency different from the characteristic frequency of 13.84 GHz, the phase difference in the output quadrature clock signals will not be 90 degrees. For instance, if the frequency of the input clock signal is 12.5 GHz, the phase error is −3.5 degree. On the other hand, if the frequency of the input clock signal is 14.0 GHz, the phase error is 3.1 degree. As used in the present disclosure, the term "phase error" refers to a phase difference that deviates from 90 degrees and may be determined, for example, by subtracting 90 degrees from a phase difference between the quadrature phase clock signals I and Q.

TABLE 1

| Freq. of input clock signal (GHz) | Resistance (Ω) | Capacitance (fF) | fc (GHz) | Phase error (degrees) |
|---|---|---|---|---|
| 12.50 | 1200 | 10 | 13.84 | −3.4 |
| 13.84 | 1200 | 10 | 13.84 | 0.0 |
| 14.00 | 1200 | 10 | 13.84 | 3.1 |

Advantageously, the tunable polyphase filter 20 of the present disclosure can operate for multiple characteristic frequencies, i.e., frequencies in a certain range, by tuning RC values of the polyphase filter 20. In one embodiment, the capacitance elements C1, C2, C3, and C4 of the polyphase filter 20 may be configured as a variable capacitor. That is, the capacitance values of the capacitance elements C1, C2, C3, and C4 may vary according to signals applied to the respective capacitance elements.

Figure 3A:
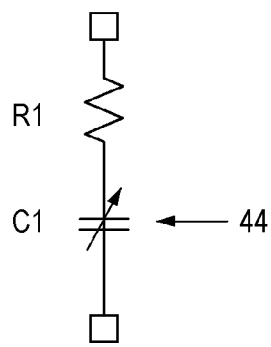
FIGS. 3A to 3C illustrate circuits of an exemplary set of resistance and capacitance elements in the polyphase filter shown in FIG. 2 according to some embodiments of the present disclosure.
Figure 3B:
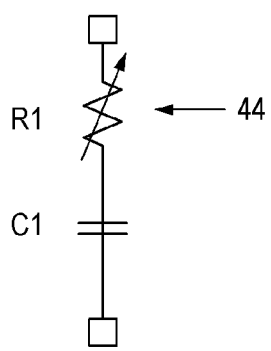
Figure 3C:
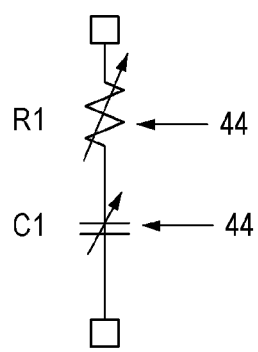

FIGS. 3A to 3C illustrate circuits of an exemplary set of resistance and capacitance elements in the polyphase filter 20 shown in FIG. 2 according to some embodiments of the present disclosure. FIG. 3A is an exemplary circuit of a set of resistance and capacitance elements in the tunable polyphase filter 20 indicated as Section A in FIG. 2. In FIG. 3A, the capacitance element C1 is a variable capacitor coupled to the resistance element R1, which is a resistor. In one embodiment, the capacitance element C1 is a varactor. In this RC circuit, the capacitance of the variable capacitor C1 varies according to the external control signal, e.g., the control signal 44 from the phase detector 30. Likewise, the capacitance of the capacitance elements C2, C3, and C4 may vary according to the control signal 44 from the phase detector 30.

In another embodiment, the resistance elements R1, R2, R3, and R4 may be a variable resistor. That is, the resistance values of the resistance elements R1, R2, R3, and R4 may vary according to signals applied to the respective resistance elements. FIG. 3B is an exemplary circuit of a set of resistance and capacitance elements in the tunable polyphase filter 20 indicated as Section A in FIG. 2. In FIG. 3B, the resistance element R1 is a variable resistor coupled to the capacitance element C1, which is a capacitor. In this RC circuit, the resistance of the variable resistor R1 varies according to the external control signal, e.g., the control signal 44 from the phase detector 30. Similarly, the resistance of the resistance elements R2, R3, and R4 may vary according to the control signal 44 from the phase detector 30.

In yet another embodiment, each of the capacitance elements C1, C2, C3, and C4 and each of the corresponding resistance elements R1, R2, R3, and R4 may both be variable. That is, the capacitance value of the capacitance elements C1, C2, C3, and C4 and the resistance value of the resistance elements R1, R2, R3, and R4 may vary according to the signals applied to the respective capacitance and resistance elements. FIG. 3C is an exemplary circuit of a set of resistance and capacitance elements in the tunable polyphase filter 20 indicated as Section A in FIG. 2. In FIG. 3C, the capacitance element C1 and the resistance element R1 are a variable capacitor and a variable resistor, respectively. The capacitance of the variable capacitor C1 and the resistance of the variable resistor R1 may vary according to the respective external control signals, e.g., the control signal 44 from the phase detector 30. Likewise, the capacitance of the capacitance elements C2, C3, and C4 and the resistance of the resistance elements R2, R3, and R4 may vary according to the control signal 44 from the phase detector 30.

In one embodiment, the control signals applied to the variable resistance elements and the variable capacitance elements are the same. In another embodiment, the control signals applied to the variable resistance elements and the variable capacitance elements may be different from one another. For example, in FIG. 3, the control signal 44 applied to the variable resistor R1 may be different from the control signal 44 applied to the variable capacitor C1.

Based on the control signal provided to the polyphase filter 20, the characteristic frequency of the polyphase filter 20 can be adjusted by tuning the resistance values of resistance elements R1 to R4 and/or the capacitance values of capacitance elements C1 to C4.

In one embodiment, the polyphase filter 20 may be a multi-stage polyphase filter that includes two or more tunable polyphase filters connected in series. For example, the polyphase filter 20 may be configured as a two-stage polyphase filter that includes two tunable polyphase filters connected in series, which will be discussed in more detail below with reference to FIG. 5.

Referring back to FIG. 1, the tunable polyphase filter 20 generates four quadrature phase clock signals 42 including the signals I, Q, IB, and QB. The four quadrature phase clock signals 42 may be amplified by the amplifiers 25.

The phase detector 30 receives the amplified quadrature phase clock signals 42 and detects a phase difference in the I/Q clock signals of the received quadrature phase clock signals. In other words, the phase detector 30 detects the phase error in the quadrature phase clock signals 42. The phase detector 30 then generates a control signal 44 adapted to tune the polyphase filter 20 based on the detected phase error.

Thus, the phase detector 30 receives the four quadrature phase clock signals 42 including the signals I, Q, IB, and QB of the tunable polyphase filter 20, detects the phase error in the four quadrature phase clock signals 42 to determine whether the quadrature phase clock signals 42 have been generated with a phase difference of 90 degrees therebetween.

Figure 4A:
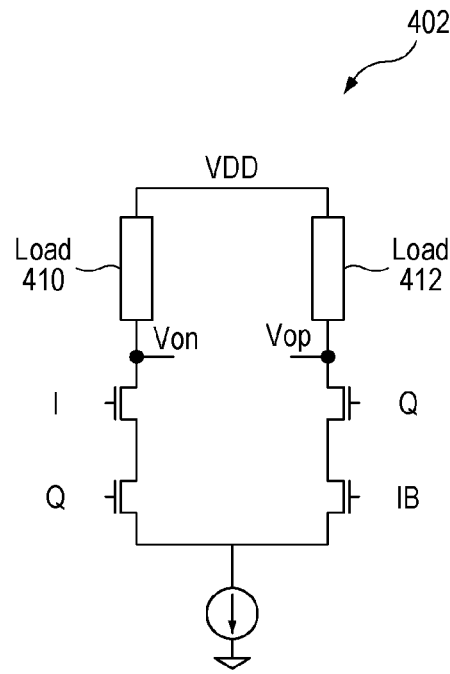
FIGS. 4A to 4C illustrate the features of an exemplary phase detector according to one embodiment of the present disclosure.
Figure 4B:
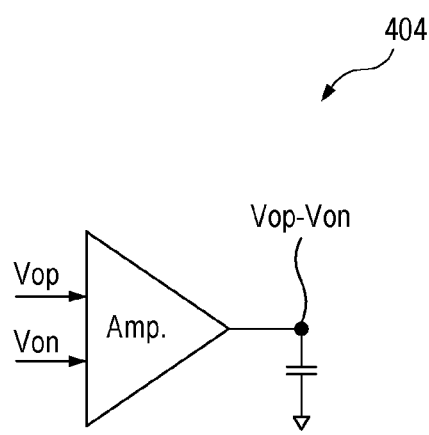

FIGS. 4A and 4B illustrate an analog phase detector 402 and an integrator 404, respectively, of the phase detector 30 according to one embodiment of the present disclosure. As shown in FIGS. 4A and 4B, the phase detector 30 may include the analog phase detector 402 and the integrator 404. In FIG. 4A, the analog phase detector 402 has four input terminals. The analog phase detector 402 may include a load element 410 and a load element 412 as needed. In one embodiment, the quadrature phase clock signals I, Q, and IB of the tunable polyphase filter 20 are used for the inputs of the analog phase detector 402, as shown in FIG. 4A. In the analog phase detector 402 of FIG. 4A, the voltage difference between Vop and Von of the analog phase detector 402 corresponds to a difference between the quadrature phase clock signals I and Q.

In particular, in the analog phase detector 402, if the difference between the quadrature phase clock signals I and Q and the difference between the quadrature phase clock signals Q and I are the same, i.e., the signals I and Q (and Q and IB) have a phase difference of 90 degrees, the voltages Von and Vop will be equal. On the other hand, if the difference between the quadrature phase clock signals I and Q and the difference between the quadrature phase clock signals Q and IB are not the same, i.e., there is a phase error in the quadrature phase clock signals 42, the voltages Von and Vop will not be equal.

The integrator 404 may be coupled to the analog phase detector 402 to receive and compare Vop and Von, and output a voltage signal corresponding to the difference between Vop and Von, as shown in FIG. 4B.

For example, if the difference between the quadrature phase clock signals I and Q is greater than the difference between the quadrature phase clock signals Q and IB, the difference between the quadrature phase clock signals I and Q is greater than 90 degrees and thus the output voltage (Vop−Von) of the analog phase detector 402 is positive. On the other hand, if the difference between the quadrature phase clock signals I and Q is smaller than the difference between the quadrature phase clock signals Q and IB, the difference between the quadrature phase clock signals I and Q is smaller than 90 degrees and the voltage (Vop−Von) of the analog phase detector 402 is negative.

Figure 4C:
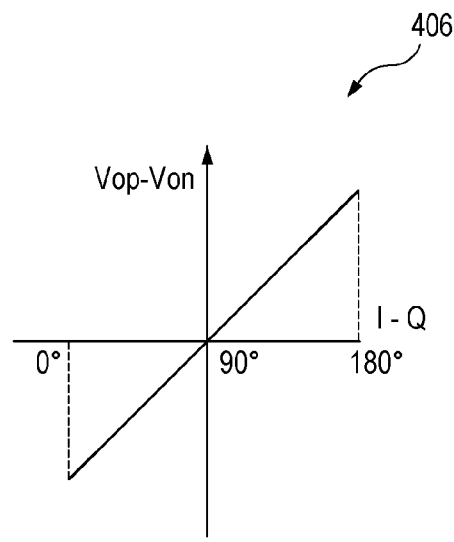

FIG. 4C illustrates a transfer function 406 of the phase detector 30 according to one embodiment of the present disclosure. The transfer function 406 of the phase detector 30 shows a relationship between the phase difference in the quadrature phase clock signals I and Q and the output voltage (Vop−Von) of the integrator 404. In this embodiment, the phase detector 30 outputs a voltage signal proportional to the phase difference in the quadrature phase clock signals. If the phase difference in the quadrature phase clock signals is 90 degrees, it means there is no phase mismatch in the quadrature phase clock signals and thus the output voltage is zero.

Although the analog phase detector 402 is illustrated as using the three quadrature signals I, Q, and IB, it may also use two or four signals of the four quadrature signals I, Q, IB, and QB, as long as the phase detector 30 generates a voltage signal based on the phase difference in the quadrature phase clock signals.

The phase detector 30 may generate the control signal 44 based on the output voltage (Vop−Von) of the analog phase detector 402. That is, the control signal 44 may be adjusted to tune the polyphase filter 20 based on the detected phase difference in the quadrature phase clock signals 42 so that the phase difference of the quadrature phase clock signals 42 becomes 90 degrees. For example, in the case where the output voltage (Vop−Von) of the phase detector 30 is positive, which may indicate that the phase difference between I/Q clock signals is greater than 90 degrees, the phase detector 30 may generate the control signal 44 adapted to tune the tunable polyphase filter 20 so that the characteristic frequency is adjusted to be higher. On the other hand, in the case where the output voltage (Vop−Von) of the phase detector 30 is negative, which may indicate that the phase difference between I/Q clock signals is smaller than 90 degrees, the phase detector 30 may generate the control signal 44 adapted to tune the tunable polyphase filter 20 so that the characteristic frequency becomes lower.

Figure 5:
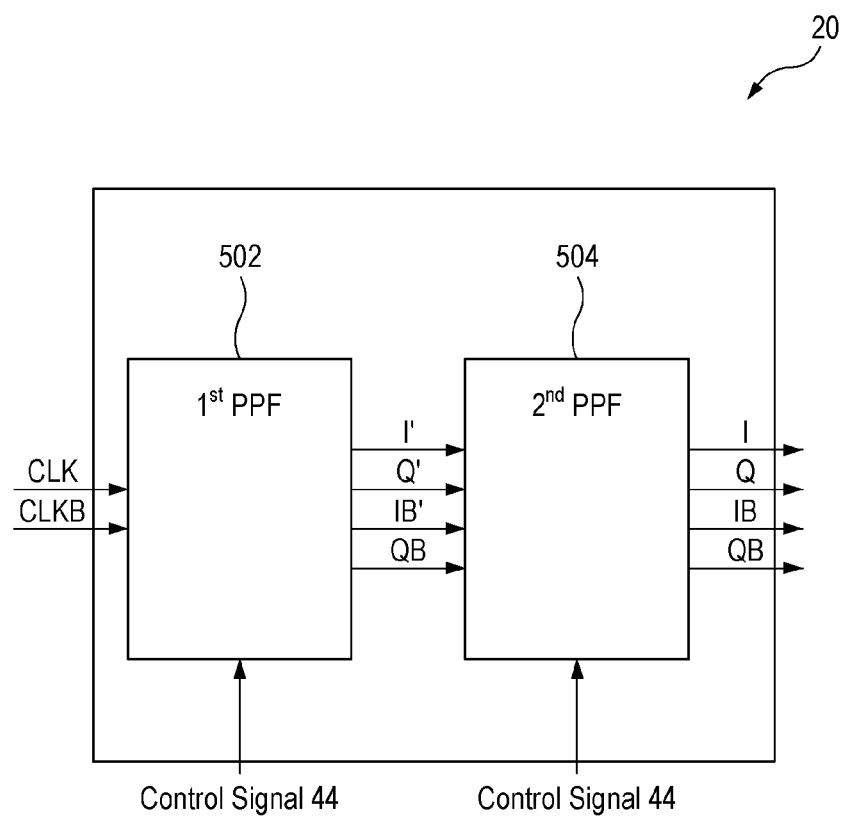
FIG. 5 illustrates a two-stage tunable polyphase filter according to one embodiment of the present disclosure.

In one embodiment, the phase detector generates the control signal 44 that includes two or more control signals to tune two or more tunable polyphase filters, as will be discussed below with reference to FIG. 5.

In one embodiment, the polyphase filter 20 may be configured as a two-stage polyphase filter that includes two polyphase filters 502 and 504. FIG. 5 illustrates an exemplary two-stage tunable polyphase filter 20 according to one embodiment of the present disclosure. The tunable polyphase filter 20 includes the first tunable polyphase filter 502 and the second tunable polyphase filter 504 connected in series. Each of the first and second tunable polyphase filters may be a tunable polyphase filter discussed in connection FIGS. 2 and 3. Initially, the first polyphase filter 502 generates output signals I', Q', IB', and QB' based on input clock signals CLK and CLKB. The second polyphase filter 504 is coupled to receive the output signals I', Q', IB', and QB' from the first polyphase filter 502 and generates quadrature phase clock signals I, Q, IB, and QB based on the output signals from the first polyphase filter 502. In one embodiment, the second polyphase filter 504 receives the output signals I', Q', IB', and QB' from the first polyphase filter 502 at four nodes, e.g., a node between R1 and C4, a node between R2 and C1, a node between R3 and C2, and a node between R4 and C3, of the polyphase filter 504 shown in FIG. 2. Although the polyphase filter 20 is illustrated as a two stage filter, it may also be a multi-phase polyphase filter that includes more than two tunable polyphase filters connected in series.

The quadrature phase clock signals I, Q, IB, and QB from the second polyphase filter 504 may then be provided to the phase detector 30, which generates a control signal 44 adapted to tune the polyphase filters 502 and/or 504. In one embodiment, the control signal 44 from the phase detector 30 may be provided to each of the first and second polyphase filters 502 and 504. In this case, the first and second polyphase filters 502 and 504 are tuned in the same manner. In another embodiment, the phase detector 30 may generate and provide two different control signal 44 and 44' to the first and second polyphase filters 502 and 504, respectively. In this case, the first and second polyphase filter 502 and 504 are tuned in a different manner Advantageously, configuring the tunable polyphase filter 20 to be a multi-stage polyphase filter may widen the range of characteristic frequencies for which the polyphase filter 20 generates accurate quadrature phase clock signals.

Figure 6:
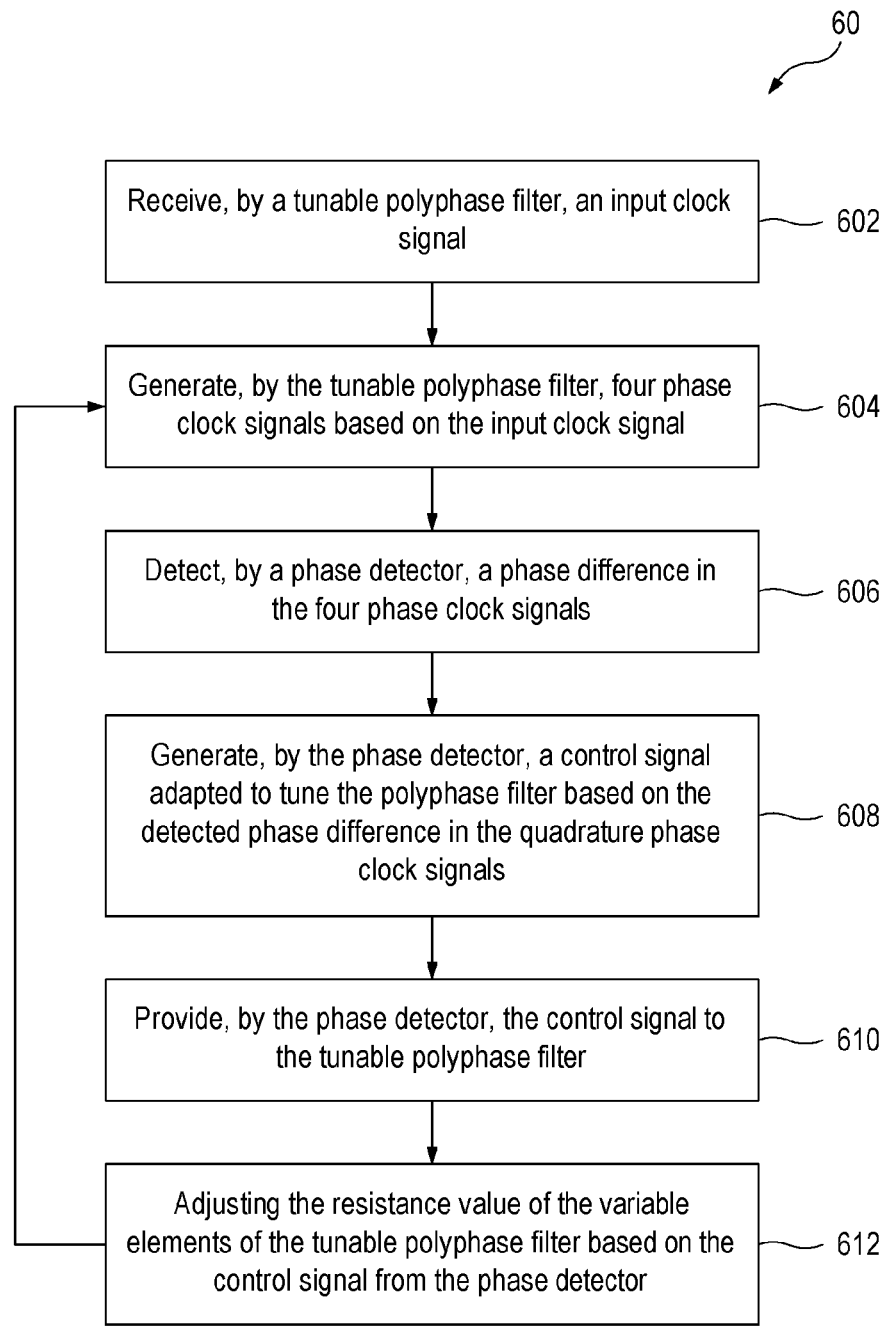
FIG. 6 illustrates a flowchart of a method for generating quadrature phase clock signals according to one embodiment of the present disclosure.

FIG. 6 illustrates a flowchart of a method 60 that may be performed by the quadrature phase clock generator 100 for generating quadrature phase clock signals according to one embodiment of the present disclosure.

At 602, the tunable polyphase filter 20 receives the input clock signal 10. At 604, the tunable polyphase filter 20 generates four quadrature phase clock signals 42 based on the input clock signal 10.

At 606, the phase detector 30 receives the four quadrature phase clock signals 42 and detects a phase difference in the four quadrature phase clock signals 42. In one embodiment, the phase detector 30 may detect a phase difference in the quadrature phase clock signals 42 using three of the quadrature phase clock signals 42 such as the three quadrature signals I, Q, and IB. In another embodiment, the phase detector 30 may detect a phase difference in the quadrature phase clock signals 42 using two or four of the quadrature phase clock signals 42.

If the frequency of the input clock signal 10 matches the characteristic frequency of the tunable polyphase filter 20, the phase difference in the four quadrature phase clock signals 42 will be 90 degrees. That is, the phase differences between the outputted quadrature phase clock signals I and Q, Q and IB, and IB and QB will be 90 degrees. However, if the frequency of the input clock signal 10 differs from the characteristic frequency of the tunable polyphase filter 20, the phase differences in the four quadrature phase clock signals 42 will not be 90 degrees. For example, the phase difference between the outputted quadrature phase clock signals I and Q may be 91 degrees or more while the phase difference between the outputted quadrature phase clock signals Q and IB may be 89 degrees or less if the frequency of the input clock signal 10 is not the characteristic frequency of the tunable polyphase filter 20. In this case, the quadrature phase clock signals 42 have a phase mismatch. In other words, the phase detector 30 may detect the phase error in the quadrature phase clock signals 42.

At 608, the phase detector generates the control signal 44 that is adapted to tune the polyphase filter based on the detected phase differences in the quadrature phase clock signals 42. In one embodiment, if the phase difference in the quadrature phase clock signals 42 is 90 degree (i.e., the phase error is zero) and there is no phase mismatch, the phase detector may not generate the control signal 44 or generate substantially zero signal as the control signal 44.

In the case that the detected phase error is positive, which may indicate that the phase difference between I/Q clock signals is greater than 90 degrees, the phase detector 30 may generate the control signal 44 that is adapted to tune the tunable polyphase filter 20 so that the characteristic frequency of the tunable polyphase filter 20 becomes higher. In the case that the detected phase error is negative, which may indicate that the phase difference between I/Q clock signals is smaller than 90 degrees, the phase detector 30 may generate the control signal 44 that is adapted to tune the tunable polyphase filter 20 so that the characteristic frequency of the tunable polyphase filter 20 becomes lower.

In one embodiment, the phase detector 30 may generate the control signal 44 by adjusting the previous control signal 44 by a predetermined value based on whether the phase error is positive or negative. In this manner, the value of the control signal 44 may be adjusted to tune the tunable polyphase filter 20 by traversing the phase calibration loop a suitable number of times until the quadratic phase clock signals 42 are in phase.

In another embodiment, the control signal 44 has a value proportional to the phase error. Additionally or alternatively, the voltage of the control signal 44 may be determined based on the amount of the phase error, for example, by referencing a look-up table defining a relationship between the amount of the phase error and the corresponding value of the control signal for the resistance and/or capacitance elements in the polyphase filter 20.

For example, as shown in Table 2 below, assuming that the tunable polyphase filter 20 is configured with variable resistors and non-variable capacitors of 10 fF and the current resistance value is 1,200Ω, the characteristic frequency is about 13.84 GHz. If the input clock frequency of 12.5 GHz is provided, the phase detector 30 detects the phase error of −3.4 degree, as shown in Table 2. In this case, the phase detector 30 generates the control signal 44 to adjust the resistance value of the variable resistors of the tunable polyphase filter 20 to be 1,273Ω, thereby reducing the characteristic frequency of the tunable polyphase filter 20 to 12.5 GHz. Likewise, if the input frequency increases to 14.0 GHz, the phase detector 30 detects the phase error of 3.1 degree as shown in Table 2, and generates the control signal 44 to adjust the resistance value of the variable resistors of the tunable polyphase filter 20 to be 1,137Ω, which increases the characteristic frequency of the tunable polyphase filter 20 up to 14.0 GHZ.

TABLE 2

| Freq. of input clock signal (GHz) | Original Resistance (Ω) | Adjusted Resistance (Ω) | Capacitance (fF) | Phase error before calibration (degrees) | Phase error after calibration (degrees) |
| --- | --- | --- | --- | --- | --- |
| 12.50 | 1200 | 1273 | 10 | −3.4 | 0.0 |
| 13.84 | 1200 | 1200 | 10 | 0.0 | 0.0 |
| 14.00 | 1200 | 1137 | 10 | 3.1 | 0.0 |

In one embodiment, the phase detector 30 generates one control signal 44 that is provided to all of the variable elements of the tunable polyphase filter 20. In another embodiment, the phase detector 30 generates two or more separate control signals 44 that are distributed to the variable resistance/capacitance elements of the tunable polyphase filter 20. For example, the phase detector may generate a first control signal 44 to be provided to the variable resistors of the tunable polyphase filter 20 and a second control signal 44' to be provided to the variable capacitors of the tunable polyphase filter 20. In one embodiment, the control signal 44 can be provided to some of the variable resistors and some of the variable capacitors of the tunable polyphase filter 20.

At 610, the phase detector 30 provides the control signal 44 to the tunable polyphase filter 20. As mentioned above, the phase detector 30 may provide two or more separate control signals to the tunable polyphase filter 20.

When the tunable polyphase filter 20 is configured to be a multi-stage polyphase filter that includes a plurality of tunable polyphase filters, the phase detector 30 may generate and provide the same control signal 44 to all of the tunable polyphase filters. In another embodiment, the phase detector 30 may generate and provide two or more control signals 44 to the tunable polyphase filters. For example, when the tunable polyphase filter 20 is a two-stage polyphase filter including the first and second tunable polyphase filters 502 and 504 as shown in FIG. 5, the phase detector may generate first and second control signals to be provided to the first and second polyphase filter 502 and 504, respectively. In one embodiment, the first control signal tunes the resistance value of the first polyphase filter 502 and the second control signal tunes the capacitance value of the second polyphase filter 504.

At 612, the resistance value of the variable resistance elements and/or the capacitance value of the variable capacitance elements of the tunable polyphase filter 20 are adjusted based on the control signal 44 provided from the phase detector 30.

For example, in the case where the phase error detected by the phase detector 30 is positive, the control signal 44 may adjust the overall RC value of the tunable polyphase filter 20 to increase so that the characteristic frequency of the tunable polyphase filter 20 decreases. In the case that the phase error detected by the phase detector 30 is negative, the control signal 44 may adjust the overall RC value of the tunable polyphase filter 20 to decrease so that the characteristic frequency of the tunable polyphase filter 20 increases.

The method 60 may proceed back to act 604 where the tunable polyphase filter 20 continues to generate the tuned quadrature phase clock signals 42 based on the input clock signal 10 and with the new RC value adjusted by the control signal 44. If a phase error still exists in the quadrature phase clock signals 42, acts 604 to 612 will repeat to provide the control signal 44 to further adjust the tunable polyphase filter 20 until a phase error is not detected in the quadrature phase clock signals 42. In this way, the tunable polyphase filter 20 and the phase detector 30 form a phase calibration loop 40 for tuning the quadrature phase clock signals 42 and eliminating the phase error in the quadrature phase clock signals 42.

Figure 7:
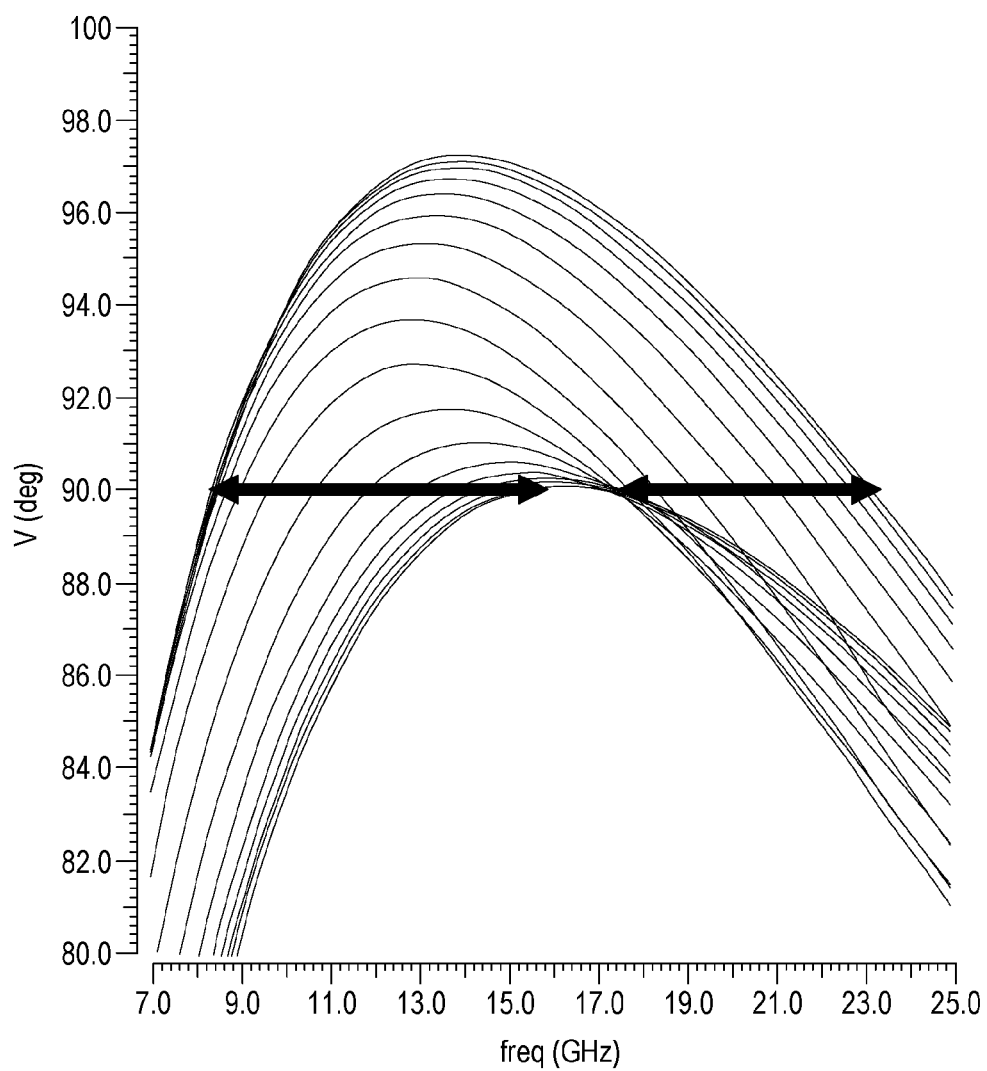
FIG. 7 illustrates a graph showing an AC response of a quadrature phase clock generator according to one embodiment of the present disclosure.

FIG. 7 illustrates a graph showing an AC response of the quadrature phase clock generator 100, which includes a two-stage polyphase filter, according to one embodiment of the present disclosure. The quadrature phase clock generator 100 of the present disclosure can generate accurate quadrature phase clock signals for multiple frequencies by tuning the tunable polyphase filter 20. For example, as shown in FIG. 7, the quadrature phase clock generator 100 may adjust the characteristic frequency of the tunable polyphase filter 20 to be any frequency in the ranges of about 7.5-15 GHz and 17.5-24.5 GHz, which can provide the correct phase difference of 90 degrees between the I and Q signals. Thus, as long as the frequency of the input clock signal 10 varies in these ranges, the quadrature phase clock generator 100 can generate the quadrature phase clock signals 42 for the input clock signal 10 without a phase error. This is advantageous over the conventional quadrature phase clock generator that can generate a correct quadrature phase clock signal only for a fixed characteristic frequency.

Figure 8:
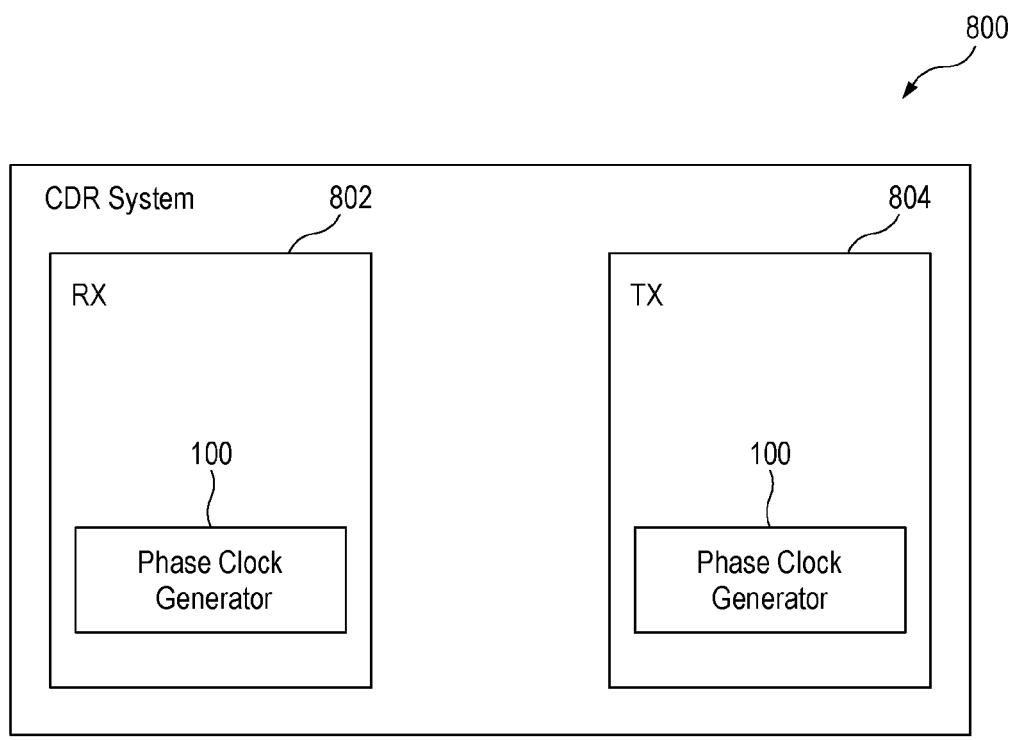
FIG. 8 illustrates a diagram of a clock and data recovery (CDR) system including one or more quadrature phase clock generators according to one embodiment of the present disclosure.

FIG. 8 illustrates a diagram of a clock and data recovery (CDR) system 800 including one or more quadrature phase clock generators 100 according to one embodiment of the present disclosure. In FIG. 8, the CDR system 800 includes a receiving (RX) unit 802 and a transmitting (TX) unit 804. In one embodiment, the CDR system 800 may include one or more transceivers (not illustrated) used in the field of wire communications, such as serial communications or optical communications. However, the devices and methods of the present disclosure are not limited to these fields and can be applied to any suitable forms of wideband communications using the CDR system 800. The RX unit 802 and the TX unit 804 may be provided in such a transceiver.

Each of the RX unit 802 and the TX unit 804 may include the quadrature phase clock generator 100. The RX unit 802 may receive data signals transmitted from another component or device and decode the received data signal using the quadrature phase clock signals generated by its quadrature phase clock generator 100. On the other hand, the TX unit 804 may encode data signals using the quadrature phase clock signals generated by its quadrature phase clock generator 100 and transmit the encoded signals to another component or device.

Although the RX unit 802 and the TX unit 804 are illustrated to be included in the CDR system 800 in FIG. 8, the RX 802 and TX 804 may be included as separate components or configured to be independent components. Further, the quadrature phase clock generator 100 in the RX unit 802 and the quadrature phase clock generator 100 in the TX unit 804 may be the same clock generator or differently configured clock generators.

Although the embodiments above are described with respect to a phase error caused by a mismatch between the frequency of an input clock signal and a characteristic frequency, the devices and methods of the present disclosure are not limited to such embodiments and can be applied to correct the phase error caused by any reason.

The descriptions in the present disclosure are provided to enable a person of ordinary skill in the art to make and use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A quadrature phase clock generator comprising:
  a tunable polyphase filter configured to receive an input clock signal and generate four quadrature phase clock signals; and
  a phase detector configured to:
    receive the four quadrature phase clock signals;
    detect a first phase difference between a first pair of quadrature phase clock signals of the four quadrature phase clock signals;
    detect a second phase difference between a second pair of quadrature phase clock signals of the four quadrature phase clock signals, wherein the second pair is different from the first pair;
    detect a phase error based on determining a difference between the first phase difference and the second phase difference;
    generate, based on (a) the first phase difference, (b) the second phase difference, and (c) the phase error, a control signal to tune the tunable polyphase filter; and
    provide the control signal to the tunable polyphase filter in a feedback loop,
  wherein the tunable polyphase filter generates, based on the control signal from the phase detector, four tuned quadrature phase clock signals as output phase clock signals.

2. The quadrature phase clock generator of claim 1, further comprising an amplifier for amplifying the four quadrature phase clock signals.

3. The quadrature phase clock generator of claim 1, wherein the tunable polyphase filter includes one or more resistance elements and one or more capacitance elements, and
wherein at least the one or more resistance elements or the one or more capacitance elements are variable elements.

4. The quadrature phase clock generator of claim 3,
wherein when the one or more resistance elements are the variable elements, resistance values of the one or more resistance elements vary according to the control signal from the phase detector, and
wherein when the one or more capacitance elements are the variable elements capacitances of the one or more capacitance elements vary according to the control signal from the phase detector.

5. The quadrature phase clock generator of claim 1, wherein the tunable polyphase filter is a two stage polyphase filter including a first tunable polyphase filter and a second tunable polyphase filter.

6. The quadrature phase clock generator of claim 5, wherein the phase detector provides the control signal to each of the first tunable polyphaser filter and second tunable polyphase filter.

7. The quadrature phase clock generator of claim 5, wherein the phase detector generates two different control signals as the control signal and provides the two different control signals to the first and second tunable polyphase filters, respectively.

8. The quadrature phase clock generator of claim 1, wherein the phase detector generates the control signal when either of the first phase difference or the second phase difference is not 90°.

9. The quadrature phase clock generator of claim 1, wherein the input clock signal comprises differential phase clock signals.

10. A clock and data recovery (CDR) system comprising:
one or more quadrature phase clock generators, each quadrature phase clock generator including:
a tunable polyphase filter configured to receive an input clock signal and generate four quadrature phase clock signals; and
a phase detector configured to:
receive the four quadrature phase clock signals;
detect a first phase difference between a first pair of quadrature phase clock signals of the four quadrature phase clock signals;
detect a second phase difference between a second pair of quadrature phase clock signals of the four quadrature phase clock signals, wherein the second pair is different from the first pair;
detect a phase error based on determining a difference between the first phase difference and the second phase difference;
generate, based on (a) the first phase difference, (b) the second phase difference, and (c) the phase error, a feedback control signal adapted to tune the tunable polyphase filter; and
provide the feedback control signal to the tunable polyphase filter,
wherein the tunable polyphase filter generates four tuned quadrature phase clock signals as output phase clock signals based on the feedback control signal from the phase detector.

11. The CDR system of claim 10, wherein each quadrature phase clock generator further comprises an amplifier for amplifying the four quadrature phase clock signals.

12. The CDR system of claim 10, wherein the tunable polyphase filter includes one or more resistance elements and one or more capacitance elements, and
wherein at least the one or more resistance elements or the one or more capacitance elements are variable elements.

13. The CDR system of claim 12,
wherein when the one or more resistance elements are the variable elements, resistance values of the one or more resistance elements vary according to the control signal from the phase detector, and
wherein when the one or more capacitance elements are the variable elements capacitances of the one or more capacitance elements vary according to the feedback control signal from the phase detector.

14. The CDR system of claim 10, wherein the tunable polyphase filter includes a first polyphase filter and a second polyphase filter, each of the first and second polyphase filters including one or more resistance elements and one or more capacitance elements, and at least the one or more resistance elements or the one or more capacitance elements being variable elements.

15. The CDR system of claim 14, wherein the phase detector provides the feedback control signal to each of the first and second polyphase filters.

16. The CDR system of claim 14, wherein the feedback control signal includes a first control signal and a second control signal, and
wherein the phase detector provides the first and second control signals to the first and second polyphase filters, respectively.

17. The CDR system of claim 10, wherein the phase detector generates the feedback control signal when (a) either of the first phase difference or the second phase difference in the four quadrature phase clock signals is not 90°.

18. A method for generating quadrature phase clock signals, comprising:
receiving, by a tunable polyphase filter, an input clock signal;
generating, by the tunable polyphase filter, four quadrature phase clock signals based on the input clock signal;
detecting, by a phase detector, a first phase difference between a first pair of quadrature phase clock signals the four quadrature phase clock signals;
detecting, by the phase detector, a second phase difference between a second pair of quadrature phase clock signals of the four quadrature phase clock signals, wherein the second pair is different from the first pair;
detecting, by the phase detector, a phase error based on determining a difference between the first phase difference and the second phase difference;
generating, by the phase detector, a control signal based on (a) the first phase difference, (b) the second phase difference, and (c) the phase error to tune the polyphase filter; and
providing, by the phase detector, the control signal to the tunable polyphase filter,
wherein the tunable polyphase filter generates four tuned quadrature phase clock signals as output phase clock signals based on the control signal from the phase detector.

* * * * *

UNITED STATES PATENT AND TRADEMARK OFFICE
CERTIFICATE OF CORRECTION

| | |
|---|---|
| PATENT NO. | : 11,271,710 B1 |
| APPLICATION NO. | : 17/106483 |
| DATED | : March 8, 2022 |
| INVENTOR(S) | : Ilhyun Cho |

It is certified that error appears in the above-identified patent and that said Letters Patent is hereby corrected as shown below:

On the Title Page

The Assignee (73) Should Read:
RENESAS ELECTRONICS AMERICA INC., Milpitas (CA)

Signed and Sealed this
Thirty-first Day of May, 2022

Katherine Kelly Vidal
*Director of the United States Patent and Trademark Office*